United States Patent [19]
Lim

[11] Patent Number: 5,985,730
[45] Date of Patent: Nov. 16, 1999

[54] METHOD OF FORMING A CAPACITOR OF A SEMICONDUCTOR DEVICE

[75] Inventor: Chan Lim, Icho-shi, Rep. of Korea

[73] Assignee: Hyundai Electronics Industries Co., Ltd., Kyoungki-do, Rep. of Korea

[21] Appl. No.: 09/095,696

[22] Filed: Jun. 11, 1998

[30] Foreign Application Priority Data

Jun. 11, 1997 [KR] Rep. of Korea ............... 97-24184
Aug. 30, 1997 [KR] Rep. of Korea ............... 97-44619

[51] Int. Cl.[6] .................................................. H01L 21/20
[52] U.S. Cl. ........................... 438/393; 438/3; 438/240
[58] Field of Search ........................... 439/393, 3, 240, 439/795, 250, 253, 396

[56] References Cited

U.S. PATENT DOCUMENTS

| | | |
|---|---|---|
| 5,362,632 | 11/1994 | Mathews . |
| 5,508,221 | 4/1996 | Kamiyama . |
| 5,677,226 | 10/1997 | Ishitani ............................. 438/3 |
| 5,786,248 | 7/1998 | Schuegraf ....................... 438/240 |
| 5,858,851 | 1/1999 | Yamagata et al. .................. 438/3 |
| 5,859,760 | 1/1999 | Park et al. ..................... 438/240 |
| 5,876,788 | 3/1999 | Bronner et al. ................. 438/240 |
| 5,877,062 | 3/1999 | Horii .............................. 438/240 |

*Primary Examiner*—Tuan H. Nguyen
*Attorney, Agent, or Firm*—Thelen Reid & Priest LLP

[57] ABSTRACT

The present invention relates to a method of forming a capacitor of a semiconductor device, which specially treats the surface of a charge storage electrode of the lower in order to improve the poor stepcoverage of the $Ta_2O_5$ film deposited by the PECVD method in the capacitor using the $Ta_2O_5$ film having a specific dielectric constant as the dielectric film, prevents the leakage current from generating according to improving the electrical characteristic of the capacitor by depositing the $Ta_2O_5$ film by use of the LPCVD method where the stepcoverage is excellent, and improves the characteristic of the semiconductor device and the trust according to the result.

20 Claims, 7 Drawing Sheets

METHOD OF FORMING A CAPACITOR OF A SEMICONDUCTOR DEVICE

BACKGROUND OF THE INVENTION

1. Field of the Invention

The present invention relates to a method of forming a capacitor of a semiconductor device, and more particularly to a method of forming a capacitor of a semiconductor device which can improve an electrical characteristic of a semiconductor device and the reliability dependent upon improving an electrical characteristic of a capacitor by using a dielectric film as dielectric of the capacitor which a step coverage is excellent.

2. Description of the Prior Art

Currently, it is difficult to form a capacitor having enough capacitance because the size of cells are decreased due to the trend in of a high integrated of a semiconductor device.

In particular, in a DPAM device composed of a MOS transistor and a capacitor, a material with a high dielectric constant is used as a dielectric film, or the thickness of a dielectric film is thin, or the surface area of a charge storage electrode is enlarged for increasing the capacitance of a capacitor.

In this regard, although not shown in the drawings, a method of manufacturing a capacitor of a semiconductor device according to the conventional method will be explained as follows.

First, after a device isolation oxide film and a gate oxide film are formed on a semiconductor substrate, MOS field effect transistor composed of a gate electrode and source/drain electrode is formed, and an interlayer insulating film is formed on the entire surface of the structure.

Next, a charge storage electrode contact hole is formed by removing the interlayer insulating film of the top portion prearranged in the charge storage electrode contact of the source/drain electrode, the charge storage electrode contacted with the source/drain electrode through the contact hole is formed into a polycrystal silicon layer pattern.

Subsequently, the dielectric film composed of an oxide film or nitride film or a laminating layer structure of oxide film-nitride film-oxide film on the surface of the charge storage electrode is spread, a capacitor is completed by forming a plate electrode wrapping the charge storage electrode on the dielectric film.

Required are, a specific dielectric constant, a low leakage current density, a high insulating destructive voltage, and a stable interfacial characteristic with the upper and lower electrode for the dielectric film in the capacitor of the semiconductor device according to the prior art such as described above.

The dielectric constant of the oxide film is about 3.8, that of the nitride film is about 7.2, the polycrystal silicon layer used as an electrode limits the capacitance because non-resistance is high to the extent of 800~1000 $\mu\Omega$ cm.

Recently, to solve these problems, a specific dielectric film such as a $Ta_2O_5$ film is used instead of the dielectric film composed of the laminating structure of oxide film-nitride film-oxide film.

The use of $Ta_2O_5$ film as the dielectric film of the capacitor of a high integrated memory device has been extensively considered. However, using $Ta_2O_5$ film as the dielectric film greatly varies the electric characteristic of the capacitor according to the method of depositing the $Ta_2O_5$ film.

That is, in case of forming a plat capacitor upon depositing the $Ta_2O_5$ film by a plasma enhanced chemical vapor deposition (hereinafter, called PECVD) method, the electrical characteristic is better than depositing the $Ta_2O_5$ film by a low pressure chemical vapor deposition(hereinafter, called LPCVD) method.

However, the capacitor used in practice is a device of various structures such as cylinder type and pin structure. In addition, it is necessary that the stepcoverage of the $Ta_2O_5$ film be excellent because the step difference of these devices is large.

Furthermore, it is problematic that the high leakage current is caused in case of applying the practical device since the stepcoverage of the $Ta_2O_5$ film deposited by the PECVD method is very poor, compared to that of the $Ta_2O_5$ film deposited by the LPCVD method.

SUMMARY OF THE INVENTION

Therefore, an object of the invention is to solve the above-mentioned problems involved in the conventional method of forming a capacitor of a semiconductor device and to provide a method of forming a capacitor of semiconductor device which can improve an electrical characteristic of a semiconductor device and the reliability dependent upon improving an electrical characteristic of a capacitor.

In accordance with one aspect, the present invention provides a method of forming a capacitor of a semiconductor device comprising the steps of: providing a semiconductor substrate; forming a charge storage electrode on top of the semiconductor substrate; nitrifying an entire surface of the charge storage electrode; plasma-treating and oxidizing a surface of the nitrified charge storage electrode; depositing a $Ta_2O_5$ film on the charge storage electrode surface by LPCVD method and plasma treating a $Ta_2O_5$ film, wherein the process of depositing and plasma treating of $Ta_2O_5$ film is carried out at least one or if not more times; thermally treating the $Ta_2O_5$ film; and forming a plate electrode to the top of the entire surface.

In accordance with another aspect, the present invention provides a method of forming a contact of a semiconductor device comprising the steps of: providing a semiconductor substrate; forming a charge storage electrode on the top of the semiconductor substrate; nitrifying an entire surface of said charge storage electrode; plasma-treating and oxidizing a surface of the nitrified charge storage electrode; depositing a $Ta_2O_5$ film to the charge storage electrode surface by the LPCVD method; plasma-treating the $Ta_2O_5$ film; thermally treating the $Ta_2O_5$ film; and forming a plate electrode on top of the entire surface.

In accordance with yet another aspect, the present invention provides a method of forming a contact of a semiconductor device comprising the steps of: providing a semiconductor substrate; forming a charge storage electrode on top of the semiconductor substrate; removing a natural oxide film of the top of the charge storage electrode; nitrifying surface of the structure; plasma-treating the nitrified surface; depositing a portion of a first $Ta_2O_5$ film to the structure surface by the LPCVD method; plasma-treating the first $Ta_2O_5$ film; depositing a second $Ta_2O_5$ film on the structure surface by the LPCVD method; plasma-treating and thermally treating under a high temperature the first and second $Ta_2O_5$ film deposited; and forming a plate electrode on top of the entire surface.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Hereinafter, a method of forming a capacitor of a semiconductor device according to an example I of the present invention will be explained in detail according to the attached drawings.

Figure 1:
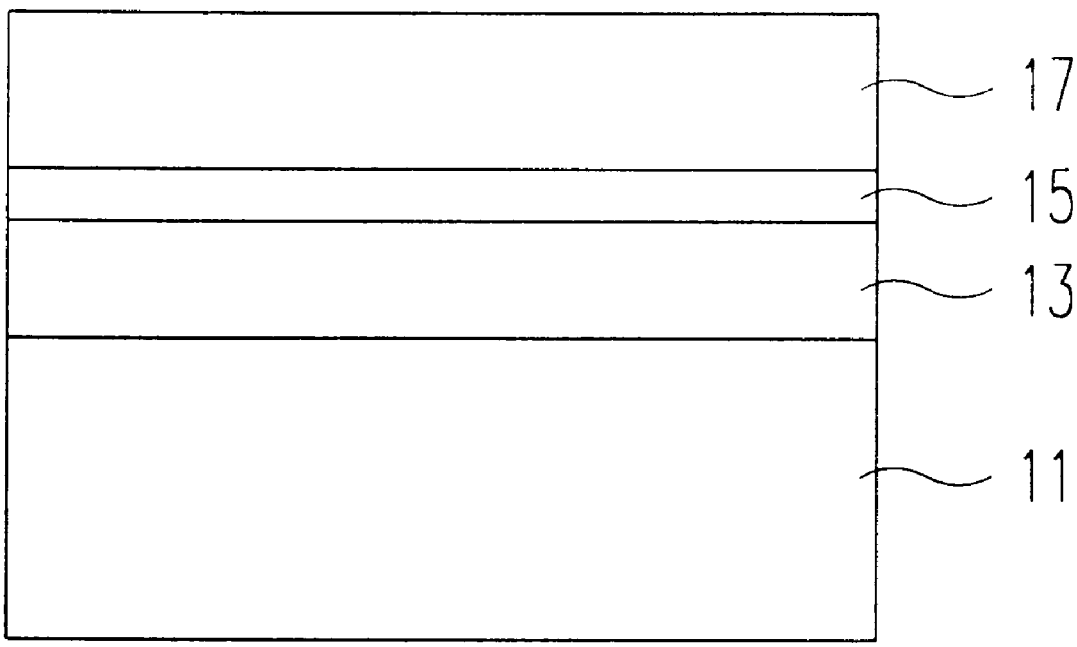
FIG. 1 is a sectional view of forming a capacitor of a semiconductor device according to the example I of the present invention.

FIG. 1 is a sectional view of forming a capacitor of a semiconductor device according to an example I of the present invention.

First, there is formed a lower structure such as an element isolation insulating film, not shown, a gate oxide film, not shown, a gate electrode, not shown, and a bit line, not shown, etc. on a semiconductor substrate 11.

Next, there is a plat film, not shown, and an interlayer insulating film, not shown, as an oxide film not doped on the entire surface. Subsequently, a contact hole, not shown, is formed on the portion prearranged into the contact portion of the interlayer insulating film, using the contact mask.

Thereafter, a polycrystal silicon film, not shown, is formed by Chemical Vapor Deposition (hereinafter, called CVD) method, on the entire surface of the structure, a contact plug, not shown, filling up the contact hole, not shown, is formed by etching the polycrystal silicon film to be left to the inner of the contact hole, not shown.

As shown in FIG. 1, a charge storage electrode 13 contacted with the contact plug, not shown, is formed. At this time, the charge storage electrode 13 is formed as a polycrystal silicon of which an impurity is doped. The structure of charge storage electrode can be formed as a cylinder type, pin type and other structure.

Furthermore, the structure of the charge storage electrode 13 can be used as a hemispherical grained silicate glass, HSG.

Then, a natural oxide film generated from the surface of charge storage electrode 13 is removed. At this time, the nature oxide film is removed by using an oxide film etching solution, that is, $HF+H_2O$ or $HF+NH_4F+H_2O$, etc.

Subsequently, the entire surface of doped polycrystal silicon of the charge storage electrode 13 is nitrified. At this time, nitrifying the charge storage electrode 13 is carried out for 40~100 sec. at a temperature of 800~900° C. through a Rapid Thermal Nitration(RTN) method using $NH_3$ gas.

Next, the surface of the nitrified charge storage electrode is treated under the plasma state, using gases containing oxygen, $N_2O$ and $O_2$ and, as a result, an oxynitride film, $SiO_xN_y$ is thinly formed.

At this time, the power for generating the plasma is 100~200 W, the nitride charge storage electrode has a substrate temperature of 150~450° C., a pressure of 1m Torr~9 Torr.

On the other hand, instead of oxidizing the surface of the charge storage electrode 15 nitrified by means of the plasma excited gas, the surface of the nitrified charge storage electrode 15 can be oxidized by dry and wet oxidation using $H_2O$ and $O_2$ vapor.

However, because the oxidation method such as above requires a process at a high temperature of above 700° C., it is problematic in that the effective oxide film thickness of a capacitor is increased by being oxidized to the polycrystal silicon 13 doped to the lower part of the nitride film as the oxidation resistance of the nitride film is lowered.

Further, the process of oxidizing the nitrified charge storage electrode 15 can be replaced by an oxidation method by depositing the remaining portion of the $Ta_2O_5$ film through the LPCVD method again after depositing a portion of the $Ta_2O_5$ film to be deposited on the surface of the nitrified charge storage electrode 15 through the PECVD method.

At this time, 5~50 Å of $Ta_2O_5$ film is deposited under the conditions of 80–200 W R.F. power, a temperature of 350~450° C., using $Ta(OC_2H_5)_5$ material and a gas, $N_2O$ or $O_2$ through the PECVD method.

As reference, in the conditions of carrying out the RTN process, if the temperature is above 900° C. or the treatment time is long, the nitrified portion is not oxidized enough at the time the following oxidation process as the nitrified portion on the surface of the charge storage electrode becomes thicker.

The following Table 1 shows the nitride film thickness on the semiconductor substrate with the corresponding RTN treatment temperature.

TABLE 1

| RTN(time 80 sec) | 850° C. | 900° C. | 950° C. |
|---|---|---|---|
| thickness of nitride film | 9.5 Å | 12.6 Å | 15.7 Å |

When the surface of the charge storage electrode 15 is nitrified as above and changed into an oxynitride film, the change in thickness of an effective oxide film of a capacitor using the $Ta_2O_5$ film is only slight/insignificant, at approximately 3 Å or less, but the characteristic of leakage current can be increased.

Next, a $Ta_2O_5$ film 17 is deposited in a constant thickness through the LPCVD method to the top of the oxidized charge storage electrode. At this time, the $Ta_2O_5$ film 17 is deposited at a temperature of 350~450° C., under a pressure of 1m Torr~9 Torr, using $Ta(OC_2H_5)_5$ material and a gas, $N_2O$ or $O_2$.

Subsequently, to remove oxygen and carbon from the $Ta_2O_5$ film, the $Ta_2O_5$ film is plasma treated at a temperature of 150~450° C. by means of the plasma gas using a gas, $N_2O$ or $O_2$.

At this time, it is treated by means of UV-$O_3$ gas activated by ultra violet rays instead of the plasma treatment by means of a gas, $N_2O$ or $O_2$.

Thereafter, to polycrystalize the $Ta_2O_5$ film, it is treated in atmosphere of $N_2O$ or $O_2$ at a temperature of 700~820° C.

Subsequently, after depositing TiN on the entire surface in the following process, the plate electrode is formed by depositing the doped polycrystal silicon, and the capacitor formation process is completed by patterning the plate electrode.

Figure 2:
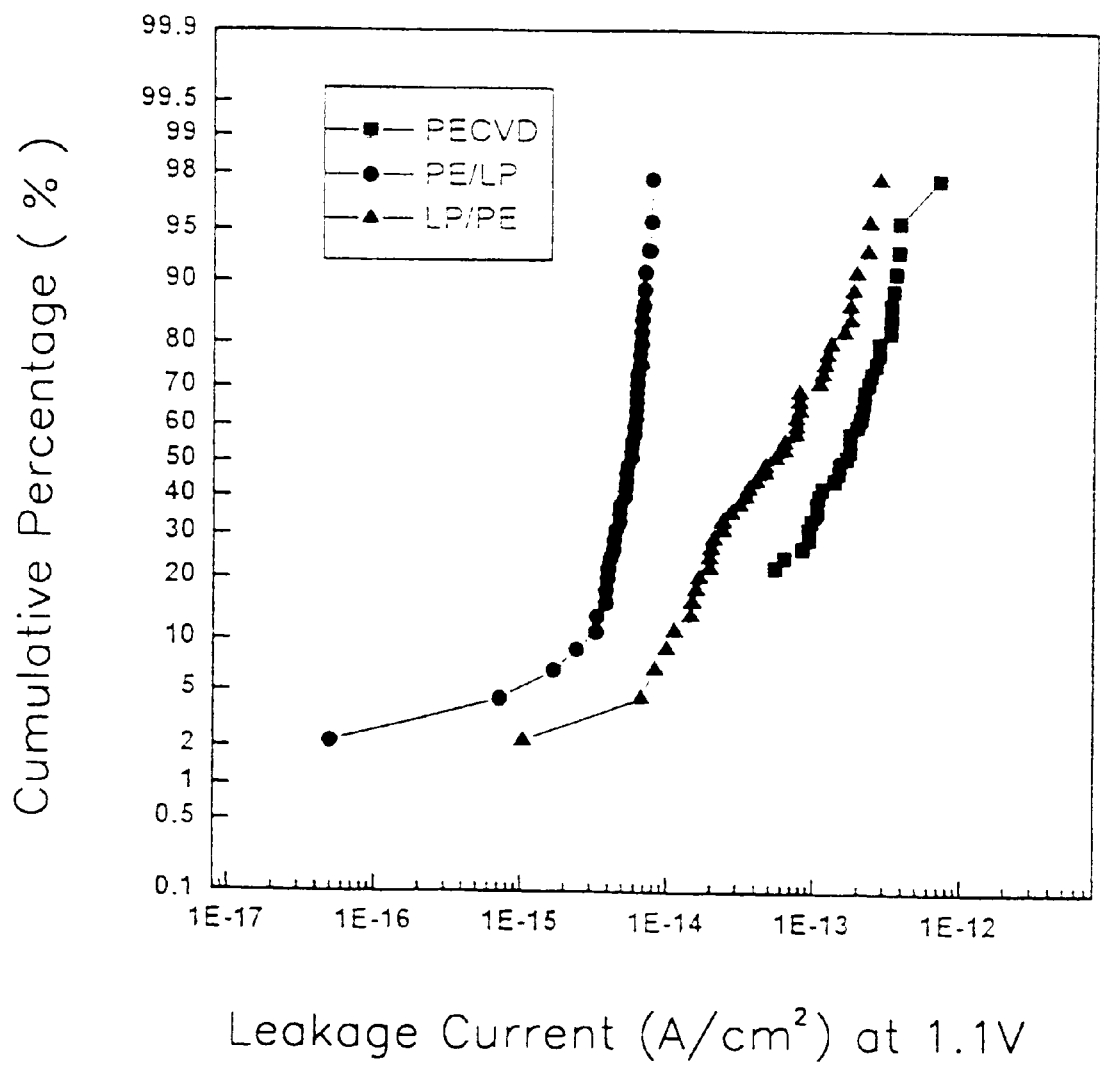
FIG. 2 is a graph showing a leakage current characteristic according to a method of depositing a $Ta_2O_5$ film in the method of forming a capacitor of a semiconductor device according to the example I of the present invention.

FIG. 2 shows the respective leakage current characteristics in cases of depositing $Ta_2O_5$ by only the PECVD method, depositing $Ta_2O_5$ by the PECVD method and the LPCVD method, and depositing $Ta_2O_5$ by the PECVD method after the LPCVD method in a $Ta_2O_5$ capacitor of which an effective oxide film thickness on the charge storage electrode of a cylinder structure is 30 Å.

As shown in FIG. 2, in case of depositing $Ta_2O_5$ by only the PECVD method, the leakage current value is the highest, in case of forming $Ta_2O_5$ thin film by use of the PECVD method and the LPCVD method in series, the leakage current value is the lowest.

Herein, in case of depositing $Ta_2O_5$ by only the PECVD method, the leakage current value is the highest because the stepcoverage of the PECVD $Ta_2O_5$ is poor.

Figure 3:
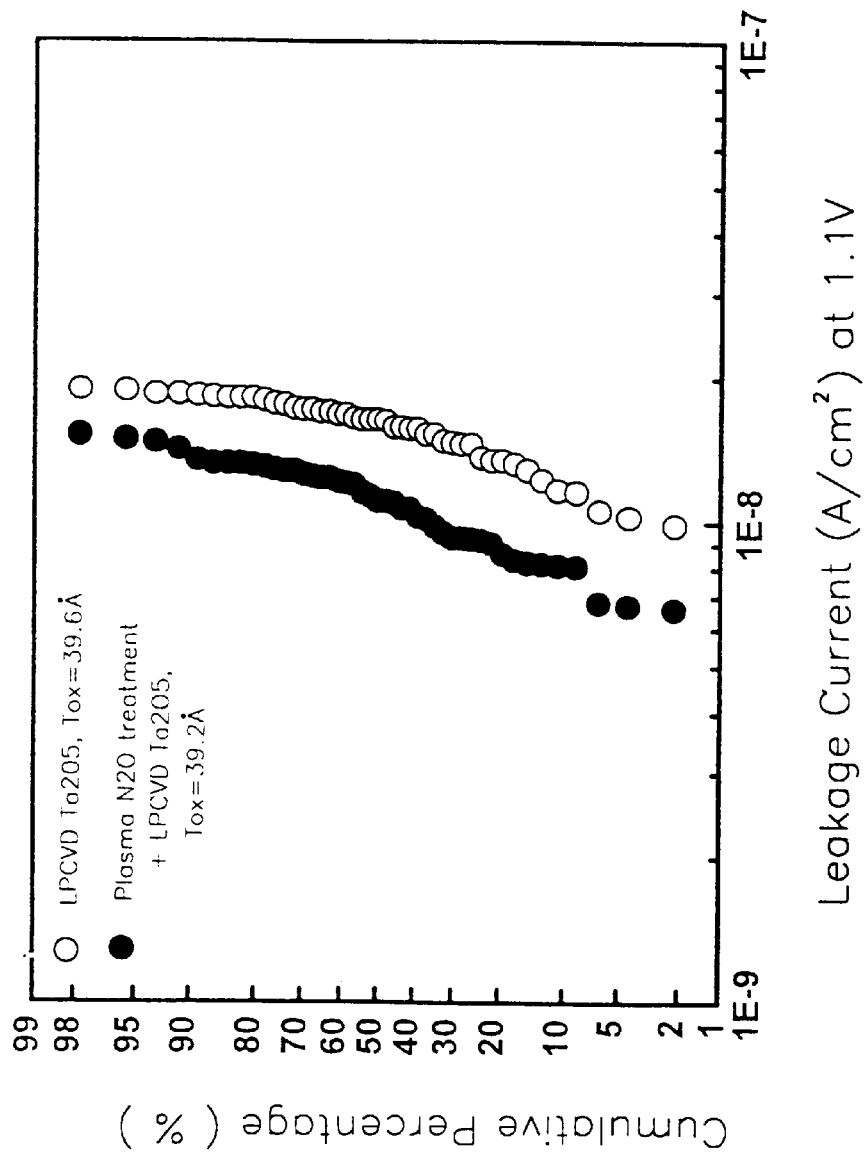
FIG. 3 is a graph showing a leakage current characteristic of a plat capacitor according to treating plasma $N_2O$ or not in the method of forming a capacitor of a semiconductor device according to the example I of the present invention.

Furthermore, FIG. 3 is a graph showing the leakage current characteristic on a plat capacitor according to whether or not the plasma $N_2O$ is treated in the method of forming a capacitor of a semiconductor device according to the example 1 the present invention.

As shown in FIG. 3, the leakage current characteristic of a plat $Ta_2O_5$ capacitor where the RTN treated surface is treated by the plasma $N_2O$, is compared to the case where only the $Ta_2O_5$ film is deposited.

The leakage current of a plat $Ta_2O_5$ capacitor in the case where the RTN treated surface is treated by means of the plasma $N_2O$, is lower than in case of depositing only the $Ta_2O_5$ film.

On the other hand, a method of forming a capacitor of a semiconductor device according to an example 2 of the present invention will be explained in detail according to the attached drawings.

Figure 4:
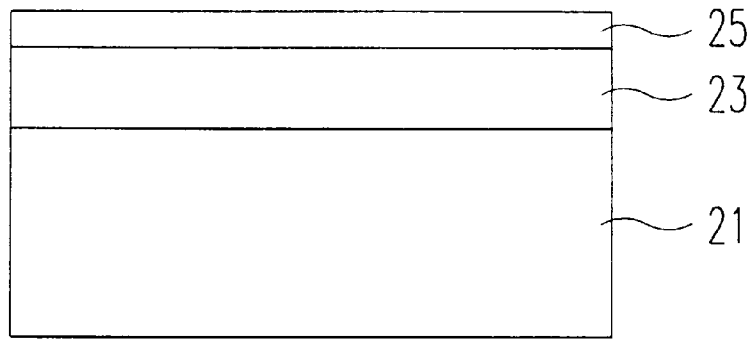
FIGS. 4 through 7 are sectional views of forming a capacitor of a semiconductor device according to an example II of the present invention.
Figure 7:
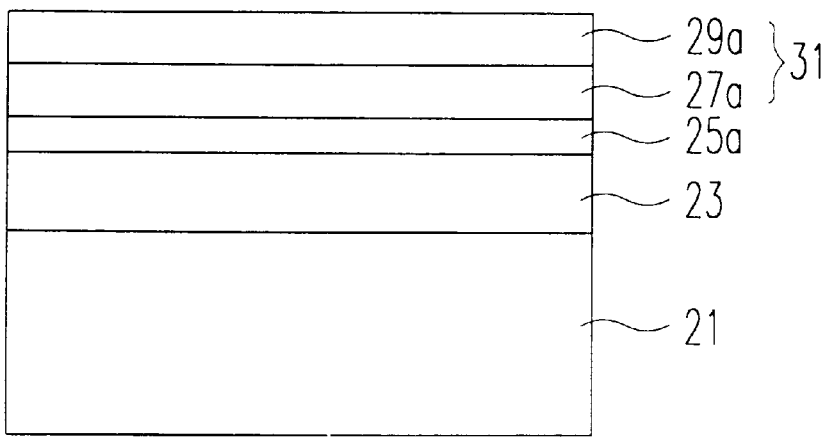

FIG. 4 and FIG. 7 is a sectional view of forming a capacitor of a semiconductor device according to the example 2 the present invention.

First, there is formed a lower structure such as an element isolation insulating film, not shown, a gate oxide film, not shown, a gate electrode, not shown, and a bit line, not shown, etc. on a semiconductor substrate 21.

Next, there is a plat film, not shown, and an interlayer insulating film, not shown, and an oxide film, not doped, on the entire surface. Subsequently, a contact hole, not shown, is formed on the portion prearranged into the contact portion of the interlayer insulating film, using the contact mask.

Thereafter, a polycrystal silicon film, not shown, is formed by Chemical Vapor Deposition (hereinafter, called CVD) method on the entire surface of the structure, and then a contact plug, not shown, filling up the contact hole, not shown, is formed by etching the polycrystal silicon film to be left to the inner of the contact hole, not shown.

As shown in FIG. 4, a charge storage electrode 23 contacted with the contact plug, not shown, is formed. At this time, the charge storage electrode 23 is formed into a polycrystal silicon of which impurity is doped. The structure of the charge storage electrode can be formed as a cylinder type, pin type or other structure.

Furthermore, the structure of the charge storage electrode 23 can be used as a hemispherical grained silicate glass, HSG.

Then, a natural oxide film generated from the surface of charge storage electrode 23 is removed. At this time, the natural oxide film is removed, using an oxide film etching solution, that is, fluoric acid solution, fluoric acid vapor or buffer oxide etchant, hereinafter, called BOE.

Subsequently, a rapid thermal nitration (hereinafter, called RTN) film is formed as the entire surface of doped polycrystal silicon of the charge storage electrode 23 is nitrified. At this time, RTN film 25 is carried for 20~120 sec. under a temperature of 800~900° C. through a Rapid Thermal Nitration (RTN) method using $NH_3$ gas.

Next, the surface of the RTN film 25 is treated under the state of plasma using a gas $N_2O$ or $O_2$. For these reasons, an electrical characteristic is improved by replacing SiN with SiON to the form of the RTN treated surface.

At this time, the plasma treating condition is carried out by using a plasma gas by means of a gas $N_2O$ or $O_2$ at a temperature 130~450° C. under a power of 100~300 w for 1~20 mins.

Figure 5:
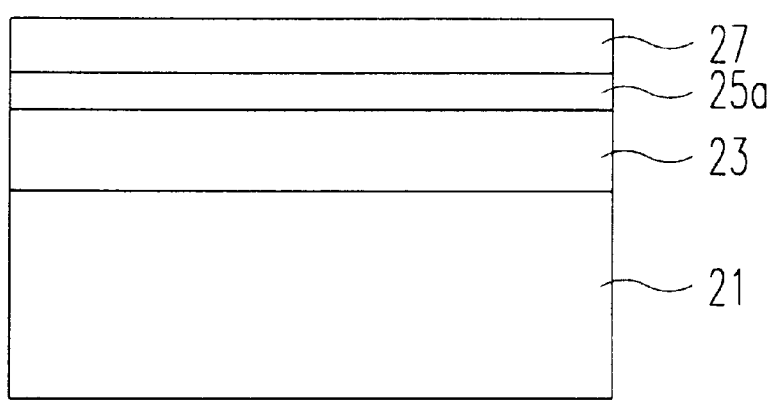

Subsequently, as shown in FIG. 5, a first $Ta_2O_5$ film 27 is deposited on the top of the plasma treated RTN film 25 with a constant thickness through the LPCVD method.

At this time, there is primarily deposited the first $Ta_2O_5$ film 27 with a thickness of 50~70 Å under a pressure of 1m Torr~6 Torr at a temperature of 370~450° C. using the material of $Ta(OC_2H_5)_5$ and $O_2$ gas or the material of $Ta(OCH_3)_5$ and $O_2$ gas. Further, the first $Ta_2O_5$ film 27 is amorphous.

Next, the first $Ta_2O_5$ film 27 is carried out under the state of plasma. At this time, the plasma treating process of the first $Ta_2O_5$ film 27 is carried out by use of a plasma gas by means of a gas $N_2O$ or $O_2$ at a temperature 130~450° C. under power of 100~300 w for 1~20 mins.

As written above, when carrying out $N_2O$ plasma treatment, the excited oxygen atom decreases defects in the first $Ta_2O_5$ film 27, therefore, the surface of the plasma treated RTN film 25 of the lower of the first $Ta_2O_5$ film 27 is changed into the shape of the more oxynitride film.

At this time, since the oxynitride film functions as an electrical barrier, compared with the nitride film, it brings about the leakage current decreasing effect, however, since the oxidation of the polycrystal silicon nitrified by $N_2O$ plasma treatment does not rapidly bring about, it is weak in having the effect of increasing the thickness of the effective oxide film of the capacitor is 3 Å and less.

Furthermore, after depositing the $Ta_2O_5$ film on the entire portion to be deposited, the plasma treatment or UV-$O_3$ treatment is effective with a constant thickness of the $Ta_2O_5$ film, however, it is not effective with the treatment of the entire $Ta_2O_5$ film.

The oxidation effect of the nitrified surface is weaker, therefore, the effect of improving the leakage current is very small, compared with treating after forming the $Ta_2O_5$ film.

Furthermore, in the case of carrying out the thermal treatment of the $Ta_2O_5$ film under an oxygen atmosphere of 750° C. and more, the oxidation of the surface of the RTN film 25 occurs quickly as compared with the plasma treatment or UV-$O_3$ treatment as oxygen is diffused and penetrated into the $Ta_2O_5$ film. Since there is a difference in the local oxidized measure, after depositing the first $Ta_2O_5$ film, it is not thermal-treated at a high temperature of 750° C.

On the other hand, in the case of forming the first $Ta_2O_5$ film with a thickness of 40~50 Å, the plasma treating process can be omitted before depositing the first $Ta_2O_5$ film.

Figure 6:
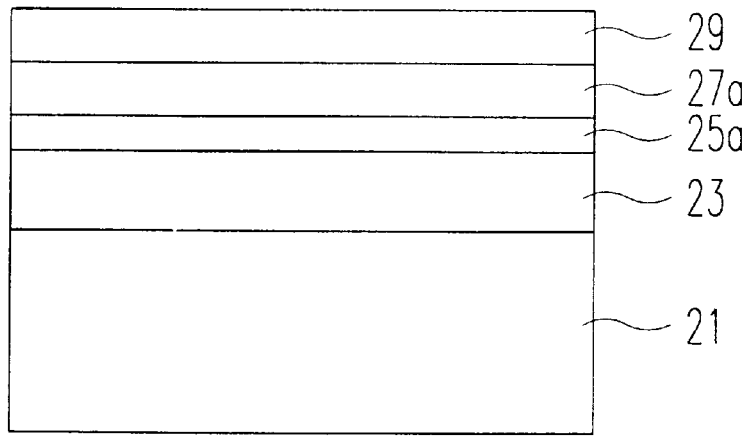

Subsequently, as shown in FIG. 6, there is formed a second $Ta_2O_5$ film 29 on the first $Ta_2O_5$ film 27 a by means of the plasma treatment through a secondary LPCVD method. At this time, there is deposited the second $Ta_2O_5$ film 29 under a pressure of 1m Torr~6 Torr at a temperature of 370~450° C. using a material of $Ta(OC_2H_5)_5$ and $O_2$ gas, or a material of $Ta(OCH_3)_5$ and $O_2$ gas.

Next, as shown FIG. 7, after the surface of the second $Ta_2O_5$ film is carried out by $N_2O$ plasma treatment, it is heat-treated for 5~30 mins under an $O_2$ atmosphere at a temperature of 750~820° C.

At this time, the heat treating process is carried out for 70~80 sec. at a temperature 800~900° C., under atmosphere $N_2O$ or $O_2$ by the RTP method instead of the heat treatment process.

Subsequently, the capacitor is completed by forming a plate electrode as polycrystal silicon or TiN on top of the entire structure.

The leakage current characteristic of the capacitor using the $Ta_2O_5$ thin film formed as above and the improved electrical characteristic will be explained with reference to FIG. 8 and FIG. 9.

Figure 8:
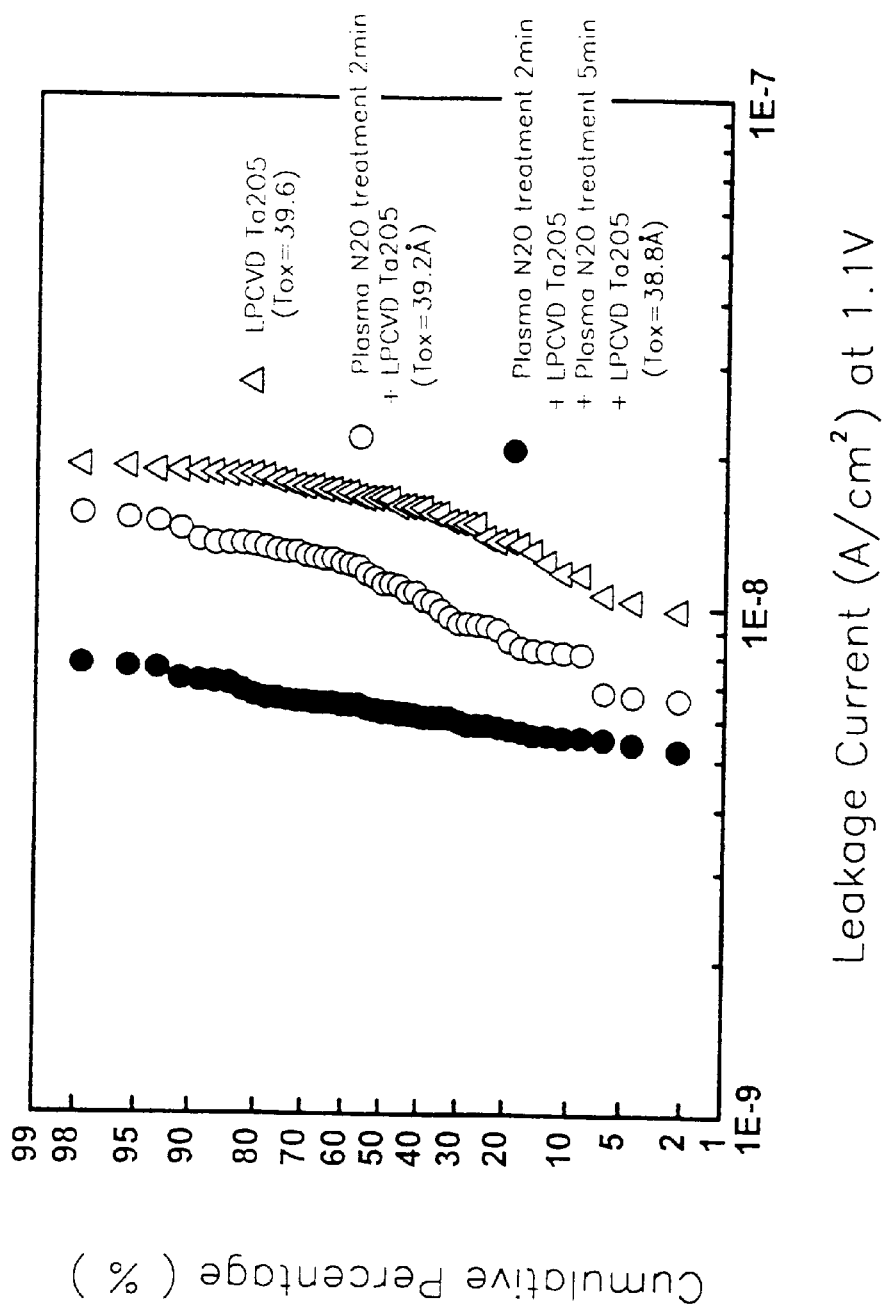
FIG. 8 is a graph showing a leakage current characteristic of a capacitor according to treating plasma $N_2O$ before depositing a $Ta_2O_5$ film in the method of forming a capacitor of a semiconductor device according to the example I of the present invention.

FIG. 8 is a graph showing a characteristic of the leakage current of the $Ta_2O_5$ capacitor according to the plasma $N_2O$ treatment.

That is, it shows the cases of depositing the $Ta_2O_5$ film by only the LPCVD method without the plasma $N_2O$ treatment, depositing $Ta_2O_5$ film by the LPCVD method with the plasma $N_2O$ treatment, depositing the remaining $Ta_2O_5$ film with treating the second plasma, after treating the RTN treated surface by the first plasma $N_2O$ before depositing the $Ta_2O_5$ film, and depositing a portion of the $Ta_2O_5$ film.

As shown in FIG. 8, it can be known that the leakage current decreases in the case of forming the entire $Ta_2O_5$ film by depositing the remaining $Ta_2O_5$ film with treating the second plasma, after treating the RTN treated surface by means of the first plasma $N_2O$ before depositing the $Ta_2O_5$ film, and depositing a portion of $Ta_2O_5$ film.

Figure 9:
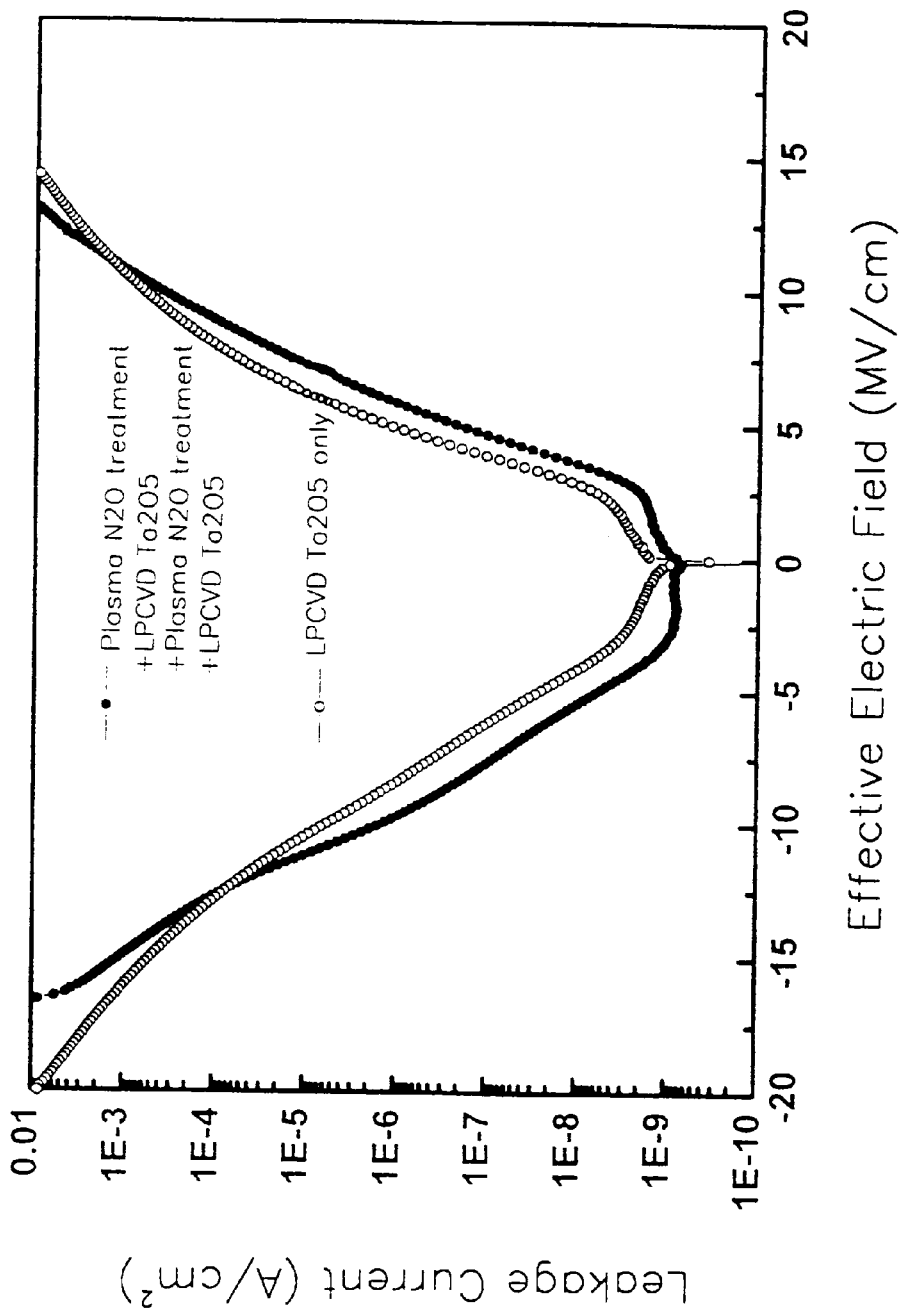
FIG. 9 is a graph showing an improved electrical characteristic of a capacitor according to treating plasma $N_2O$ before depositing a $Ta_2O_5$ film in the method of forming a capacitor of a semiconductor device according to the example II of the present invention.

Furthermore, FIG. 9 is a graph showing the improved electrical characteristic of the $Ta_2O_5$ capacitor according to the plasma $N_2O$ treatment before and during depositing the $Ta_2O_5$ film.

That is, it shows the cases of depositing $Ta_2O_5$ film by the LPCVD method without the plasma $N_2O$ treatment, depositing the remaining $Ta_2O_5$ film with treating the second plasma $N_2O$, after treating the RTN treated surface by the first plasma $N_2O$ before depositing the $Ta_2O_5$ film, and depositing a portion of $Ta_2O_5$ film.

As shown in FIG. 9, it can be known that the leakage current decreases the improvement in the electrical characteristic of the $Ta_2O_5$ capacitor in the case of forming the entire $Ta_2O_5$ film by depositing the remaining $Ta_2O_5$ film with treating the second plasma, after treating the RTN treated surface by means of the first plasma $N_2O$ before depositing the $Ta_2O_5$ film, and depositing a portion of $Ta_2O_5$ film, compared to depositing the $Ta_2O_5$ film by the LPCVD method without the plasma $N_2O$ treatment.

As explained above, a method of forming a capacitor of a semiconductor device according to an example 1 of the present invention specially treats the surface of a charge storage electrode of the lower before depositing the $Ta_2O_5$ film by the LPCVD method in order to improve the poor stepcoverage of the $Ta_2O_5$ film deposited by the PECVD method in the capacitor using the $Ta_2O_5$ film having a specific dielectric constant as the dielectric film, prevents the leakage current from generating according to improving the electrical characteristic of the capacitor by depositing the $Ta_2O_5$ film by use of the LPCVD method, or the PECVD method and the LPCVD method thereafter, and if has advantages that improves the characteristic of the semiconductor device and the reliability according to the result.

Furthermore, a method of forming a capacitor of a semiconductor device according to an example 2 of the present invention prevents the leakage current from generating upon improving the electrical characteristic of the capacitor by depositing the remaining second $Ta_2O_5$ film after specially treating the first $Ta_2O_5$ film deposited primarily, by depositing the entire $Ta_2O_5$ film twice through the LPCVD method in order to improve the leakage current characteristic of the $Ta_2O_5$ film deposited by LPCVD method in the capacitor using the $Ta_2O_5$ film having a specific dielectric constant as the dielectric film, and has the advantages of improving the characteristic of the semiconductor device and the reliability according to the result.

Although the preferred embodiments of the invention have been disclosed for illustrative purposes, those skilled in the art will appreciate that various modifications, additions and substitutions are possible, without departing from the scope of the invention as disclosed in the accompanying claims.

What is claimed is:

1. A method of forming a capacitor of a semiconductor device comprising steps of:

providing a semiconductor substrate;

forming a charge storage electrode on the top of said semiconductor substrate;

nitrifying an entire surface of said charge storage electrode;

plasma-treating and oxidizing a surface of said nitrified charge storage electrode;

depositing a $Ta_2O_5$ film on said charge storage electrode surface by LPCVD method and plasma treating a $Ta_2O_5$ film, wherein the process of depositing and plasma treating of a $Ta_2O_5$ film is carried out at least one if not more times;

thermally treating said $Ta_2O_5$ film; and forming a plate electrode on the top of said entire surface.

2. The method according to claim 1, wherein said nitrifying process of said charge storage electrode is carried out at a temperature of 800~900° C. for 40~100 secs. by RTN method.

3. The method according to claim 1, wherein a surface of said nitrified charge storage electrode is oxidized under a temperature of 150~450° C. using an excited plasma gas, $N_2O$ or $O_2$.

4. The method according to claim 1, wherein said surface of said nitrified charge storage electrode is oxidized by a dry or wet oxidizing method, using vapor, $H_2O$ or $O_2$.

5. The method according to claim 1, wherein said plasma treating process of said $Ta_2O_5$ film is carried out at the temperature of 150~450° C. by use of a gas, $N_2O$ or $O_2$ or a gas $UV-O_3$ activated by ultraviolet.

6. The method according to claim 1, wherein the thermal treating process of said $Ta_2O_5$ film is carried out at the temperature 700~820° C. with a gas atmosphere of $N_2O$ or $O_2$ and thereby said $Ta_2O_5$ film is polycrystalized.

7. A method of forming a capacitor of a semiconductor device comprising steps of:

providing a semiconductor substrate;

forming a charge storage electrode on the top of said semiconductor substrate;

nitrifying an entire surface of said charge storage electrode;

plasma-treating and oxidizing a surface of said nitrified charge storage electrode;

depositing a $Ta_2O_5$ film on said charge storage electrode surface by the LPCVD method;

plasma-treating said $Ta_2O_5$ film;

thermally treating said $Ta_2O_5$ film; and forming a plate electrode on the top of said entire surface.

8. The method according to claim 7, wherein said nitrifying process of said charge storage electrode is carried out at a temperature of 800~900° C. for 40~100 secs. by RTN method.

9. The method according to claim 7, wherein a surface of said nitrified charge storage electrode is oxidized under a temperature of 150~450° C., using an excited plasma gas, $N_2O$ or $O_2$, or by a dry or wet oxidizing method, using vapor, $H_2O$ or $O_2$.

10. The method according to claim 7, wherein said oxidation process of said nitrified charge storage electrode surface is carried out by a step of depositing the remaining portion of said $Ta_2O_5$ film by the LPCVD method after depositing a portion of said $Ta_2O_5$ film by the PECVD method.

11. The method according to claim 10, wherein said process of depositing said $Ta_2O_5$ film by said PECVD method is carried out at a temperature of 350~450° C. and pressure of 1m Torr ~9 Torr by use of a gas, $N_2O$ or $O_2$ or a material $Ta(OC_2H_5)_5$ and said $Ta_2O_5$ film has a thickness of 5~50 Å.

12. The method according to claim 7, wherein said plasma treating process of said $Ta_2O_5$ film is carried out at a temperature of 150~450° C. by use of a gas, $N_2O$ or $O_2$, or a gas $UV-O_3$ activated by ultraviolet.

13. The method according to claim 7, wherein a thermal treating process of said $Ta_2O_5$ film is carried out at a temperature of 700~820° C. with a gas atmosphere of $N_2O$ or $O_2$ and said $Ta_2O_5$ film is polycrystalized.

14. A method of forming a capacitor of a semiconductor device comprising steps of:

providing a semiconductor substrate;

forming a charge storage electrode on the top of said semiconductor substrate;

removing a natural oxide film from the top of said charge storage electrode;

nitrifying an surface of said structure;

plasma-treating said nitrified surface;

depositing a portion of a first $Ta_2O_5$ film on said structure surface by the LPCVD method;

plasma-treating said first $Ta_2O_5$ film;

depositing a second $Ta_2O_5$ film on said structure surface by the LPCVD method;

plasma-treating and thermally treating said first and second $Ta_2O_5$ film; and forming a plate electrode on top of said entire surface.

15. The method according to claim 14, wherein said nitrifying process of said charge storage electrode is carried out using RTN method.

16. The method according to claim 14, wherein said first $Ta_2O_5$ film is deposited with a thickness of 50~70 Å.

17. The method according to claim 14, wherein said first and second $Ta_2O_5$ film is deposited in an amorphous state.

18. The method according to claim 14, wherein said plasma treating process is carried out for 1~20 mins. at a temperature of 130~450° C. and power of 100~300 w.

19. The method according to claim 14, wherein said thermal treating process is carried out for 5~30 mins. at a temperature of 750~820° C. under a gas atmosphere of $O_2$, or for 70~80 secs. at a temperature of 800~900° C. under a gas atmosphere of $O_2$ or $N_2O$.

20. The method according to claim 14, wherein the thickness of said first $Ta_2O_5$ film is deposited with a thickness of 40~50 Å without plasma- treating said nitrified surface.

* * * * *